(12) United States Patent
Starr

(10) Patent No.: US 7,019,570 B2
(45) Date of Patent: Mar. 28, 2006

(54) DUAL-GAIN LOOP CIRCUITRY FOR PROGRAMMABLE LOGIC DEVICE

(75) Inventor: Gregory Starr, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/655,853

(22) Filed: Sep. 5, 2003

(65) Prior Publication Data

US 2005/0052208 A1 Mar. 10, 2005

(51) Int. Cl.
*H03L 7/06* (2006.01)

(52) U.S. Cl. .................. 327/156; 327/159; 331/1 A

(58) Field of Classification Search ............. 327/156, 327/159, 160, 162; 331/1 A, 17, 25
See application file for complete search history.

(56) References Cited

U.S. PATENT DOCUMENTS

| | | | | |
|---|---|---|---|---|
| 3,473,160 | A | | 10/1969 | Wahlstrom .................. 326/41 |
| 4,272,729 | A | * | 6/1981 | Riley, Jr. ................. 331/1 A |
| 4,473,801 | A | * | 9/1984 | Maurer et al. ............. 329/360 |
| 4,494,021 | A | | 1/1985 | Bell et al. .................. 307/591 |
| 4,527,127 | A | * | 7/1985 | Brown ...................... 329/308 |
| 4,633,488 | A | | 12/1986 | Shaw ........................ 375/120 |
| 4,719,593 | A | | 1/1988 | Threewitt et al. ........... 364/900 |
| 4,857,866 | A | | 8/1989 | Tateishi .................... 331/1 A |
| 4,868,522 | A | | 9/1989 | Popat et al. .................. 331/2 |
| 4,959,646 | A | | 9/1990 | Podkowa et al. ........ 340/825.83 |
| 4,972,163 | A | * | 11/1990 | Van Der Plas .............. 331/12 |
| 5,072,195 | A | | 12/1991 | Graham et al. ................ 331/2 |
| 5,075,575 | A | | 12/1991 | Shizukuishi et al. ........ 307/465 |
| 5,079,519 | A | | 1/1992 | Ashby et al. .............. 331/1 A |
| 5,121,014 | A | | 6/1992 | Huang ...................... 327/276 |
| 5,133,064 | A | | 7/1992 | Hotta et al. ................ 395/550 |

(Continued)

FOREIGN PATENT DOCUMENTS

EP 0 266 065 5/1988

(Continued)

OTHER PUBLICATIONS

Advanced Micro Devices, Inc., "Am2971 Programmable Event Generator (PEG)," Publication No. 05280, Rev. C, Amendment/0, pp. 4-286-4-303 (Jul. 1986).

(Continued)

*Primary Examiner*—Timothy P. Callahan
*Assistant Examiner*—An T. Luu
(74) *Attorney, Agent, or Firm*—Fish & Neave IP Group of Ropes & Gray LLP; Jeffrey H. Ingerman; Chia-Hao La

(57) ABSTRACT

A loop circuit (PLL or DLL) uses a dual-gain voltage-controlled component (VCO or VCDL) to achieve a phase (and frequency) lock with reduced jitter. A coarse control feedback path includes a detector for achieving an approximate lock. This path operates over a wide range and therefore feeds a VCO or VCDL input with relatively high gain. However, input on that path is fixed once coarse frequency lock is achieved, so it does not contribute to jitter. A fine control path includes a detector whose output fine tunes the lock. Although this path is susceptible to noise, its operating range is relatively small, so its VCO or VCDL input has relatively low gain. Therefore jitter from magnification of noise by that gain is relatively small. The loop circuit can be used in a programmable logic device, in which case various loop parameters may be determined by programmable values.

40 Claims, 7 Drawing Sheets

U.S. PATENT DOCUMENTS

| | | | |
|---|---|---|---|
| 5,204,555 A | 4/1993 | Graham et al. | 307/465 |
| 5,208,557 A | 5/1993 | Kersh | 331/57 |
| 5,239,213 A | 8/1993 | Norman et al. | 326/38 |
| 5,349,544 A | 9/1994 | Wright et al. | 364/600 |
| 5,363,419 A * | 11/1994 | Ho | 375/376 |
| 5,394,116 A | 2/1995 | Kasturia | 331/34 |
| 5,397,943 A | 3/1995 | West et al. | 326/39 |
| 5,418,499 A | 5/1995 | Nakao | 331/57 |
| 5,420,544 A | 5/1995 | Ishibashi | 331/11 |
| 5,424,687 A | 6/1995 | Fukuda | 331/11 |
| 5,448,191 A | 9/1995 | Meyer | 327/105 |
| 5,477,182 A | 12/1995 | Huizer | 327/261 |
| 5,506,878 A | 4/1996 | Chiang | 377/39 |
| 5,542,083 A | 7/1996 | Hotta | 709/400 |
| 5,581,214 A | 12/1996 | Iga | 331/16 |
| 5,629,651 A | 5/1997 | Mizuno | 331/34 |
| 5,642,082 A | 6/1997 | Jefferson | 331/25 |
| 5,646,564 A | 7/1997 | Erickson et al. | 327/158 |
| 5,656,959 A | 8/1997 | Chang et al. | 327/105 |
| 5,691,669 A | 11/1997 | Tsai et al. | 331/17 |
| 5,699,020 A | 12/1997 | Jefferson | 331/17 |
| 5,739,725 A * | 4/1998 | Ferraiolo et al. | 331/57 |
| 5,742,180 A | 4/1998 | DeHon et al. | 326/40 |
| 5,744,991 A * | 4/1998 | Jefferson et al. | 327/158 |
| RE35,797 E | 5/1998 | Graham et al. | 326/40 |
| 5,777,360 A | 7/1998 | Rostoker et al. | 257/315 |
| 5,815,016 A | 9/1998 | Erickson | 327/158 |
| 5,847,617 A | 12/1998 | Reddy et al. | 331/57 |
| 5,850,164 A | 12/1998 | Mellot | 331/177 R |
| 5,889,436 A | 3/1999 | Yeung et al. | 331/2 |
| 5,900,757 A | 5/1999 | Aggarwal et al. | 327/198 |
| 5,952,891 A | 9/1999 | Boudry | 331/57 |
| 5,952,892 A | 9/1999 | Szajda | 331/57 |
| 5,963,069 A | 10/1999 | Jefferson et al. | 327/158 |
| 5,970,110 A | 10/1999 | Li | 377/48 |
| 5,974,105 A | 10/1999 | Wang et al. | 375/376 |
| 5,987,543 A | 11/1999 | Smith | 710/70 |
| 5,999,025 A | 12/1999 | New | 327/156 |
| 6,014,048 A | 1/2000 | Talaga, Jr. et al. | 327/156 |
| 6,043,677 A | 3/2000 | Albu et al. | 326/39 |
| 6,069,506 A | 5/2000 | Miller, Jr. et al. | 357/156 |
| 6,069,507 A | 5/2000 | Shen et al. | 327/156 |
| 6,097,777 A * | 8/2000 | Tateishi et al. | 375/376 |
| 6,104,222 A | 8/2000 | Embree | 327/156 |
| 6,114,915 A | 9/2000 | Huang et al. | 331/25 |
| 6,141,394 A | 10/2000 | Linebarger et al. | 375/376 |
| 6,144,242 A | 11/2000 | Jeong et al. | 327/269 |
| 6,157,266 A | 12/2000 | Tsai et al. | 331/57 |
| 6,249,189 B1 | 6/2001 | Wu et al. | 331/18 |
| 6,252,419 B1 | 6/2001 | Sung et al. | 326/38 |
| 6,278,332 B1 | 8/2001 | Nelson et al. | 331/17 |
| 6,320,469 B1 | 11/2001 | Friedberg et al. | 331/1 A |
| 6,326,826 B1 * | 12/2001 | Lee et al. | 327/161 |
| 6,366,174 B1 * | 4/2002 | Berry et al. | 331/78 |
| 6,373,278 B1 | 4/2002 | Sung et al. | 326/38 |
| 6,411,150 B1 | 6/2002 | Williams | 327/281 |
| 6,462,623 B1 | 10/2002 | Horan et al. | 331/17 |
| 6,483,886 B1 | 11/2002 | Sung et al. | 375/376 |
| 6,633,185 B1 * | 10/2003 | Starr | 327/157 |
| 6,680,632 B1 * | 1/2004 | Meyers et al. | 327/155 |
| 2001/0033188 A1 | 10/2001 | Aung et al. | 327/141 |

FOREIGN PATENT DOCUMENTS

| | | |
|---|---|---|
| EP | 0 416 930 | 3/1991 |
| EP | 0 778 517 | 6/1997 |
| EP | 0 987 822 | 3/2000 |
| EP | 1 056 207 | 11/2000 |
| JP | 1-137646 | 5/1989 |
| JP | 10215156 | 8/1998 |

OTHER PUBLICATIONS

Advanced Micro Devices, Inc., "AmPAL*22S8 20-Pin IMOX PAL-Based Sequencer," Publication No. 06207, Rev. B, Amendment/0, pp. 4-102-4-121 (Oct. 1986).

Agere Systems, Inc., "ORCA ORT82G5 0.622/1.0-1.25/2.0-2.5/3.125 Gbits/s Backplane Interface FPSC," Preliminary Data Sheet, pp. 1-35 (Jul. 2001).

Agere Systems, Inc., "ORCA 8850 Field-Programmable System Chip (FPSC) Eight Channel x850 Mbits/s Backplane Transceiver," Product Brief, pp. 1-6 (Jul. 2001).

Agere Systems, Inc., "ORCA 8850 Field-Programmable System Chip (FPSC) Eight Channel x850 Mbits/s Backplane Transceiver," Product Brief, pp. 1-36 (Aug. 2001).

DynaChip Corp., "Application Note: Using Phase Locked Loops in DL6035 Devices" (1998).

DynaChip Corp., DY6000 Family Datasheet (Dec. 1998).

Ko, U., et al., "A 30-ps Jitter, 3.6 $\mu$s Locking, 3.3-Volt Digital PLL for CMOS Gate Arrays," *Proceedings of the IEEE 1993 Custom Integrated Circuits Conference*, Publication No. 0-7803-0826-3/93, pp. 23.3.1-23.3.4 (May 9-12, 1993).

LSI Logic Corp., 500K Technology Design Manual (Document DB04-000062-00, First Edition), pp. 8-1-8-33 (Dec. 1996).

Lucent Technologies, Inc., Optimized Reconfigurable Cell Array (ORCA®)OR3Cxxx/OR3Txxx Series Field-Programmable Gate Arrays, Preliminary Product Brief, (Nov. 1997).

Lucent Technologies, Inc., ORCA® Series 3 Field-Programmable Gate Arrays, Preliminary Data Sheet, Rev. 01 (Aug. 1998).

Monolithic Memories, Inc., "Programmable Array Logic PAL20RA10-20 Advance Information," pp. 5-95-5-102 (Jan. 1988).

National Semiconductor Corp., *LVDS Owner's Manual & Design Guide* (Apr. 25, 1997).

National Semiconductor Corp., "DS90CR285/DS90CR286 +3.3V Rising Edge Data Strobe LVDS 28-Bit Channel Link-66 MHZ," (Mar. 1998).

Xilinx, Inc., Virtex 2.5V Field Programmable Gate Arrays Advance Product Specification (Version 1.0) (Oct. 20, 1998).

Xilinx, Inc., Application Note: Using the Virtex Delay-Locked Loop (Version 1.31) (Oct. 21, 1998).

Zaks, R., et al., *From Chips to Systems: An Introduction to Microcomputers*, pp. 54-61 (Prentice-Hall, Inc., Englewood Cliffs, N.J., 1987).

\* cited by examiner

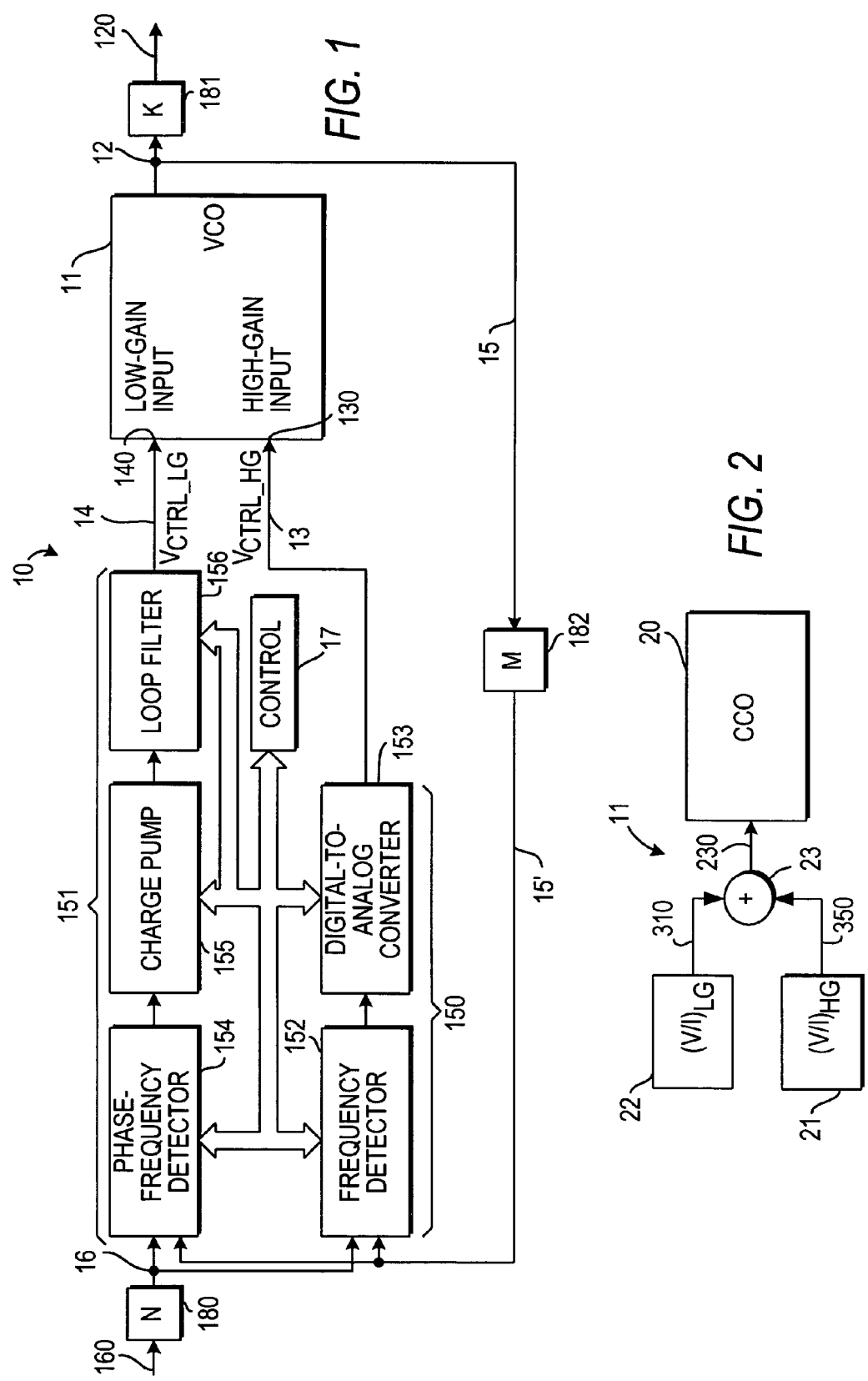

DUAL-GAIN LOOP CIRCUITRY FOR PROGRAMMABLE LOGIC DEVICE

BACKGROUND OF THE INVENTION

This invention relates to dual-gain phase-locked loop circuitry and delay-locked loop circuitry with reduced jitter, and particularly to such circuitry for use in a programmable logic device.

It is known to incorporate phase-locked loop ("PLL") circuitry or delay-locked loop ("DLL") circuitry on programmable logic devices ("PLDs"). For example, it has become common for PLDs to accommodate various input/output standards, some of which require very accurate high-speed clocks. One way of providing such clocks is to provide PLL or DLL circuitry on the PLD. For convenience, PLLs and DLLs will be referred to collectively herein as "loop circuits" where appropriate.

A basic PLL includes a phase-frequency detector ("PFD"), a charge pump, a loop filter and a voltage-controlled oscillator ("VCO"), connected in series. The input or reference frequency is one input to the PFD. The output of the VCO, which is the output of the PLL, is also fed back to another input of the PFD. If the feedback signal is not locked to the input reference signal, then the PFD output will be a signal (voltage) whose sign is indicative of whether the output leads or lags and whose magnitude is indicative of the amount of lead or lag. That signal is filtered by the charge pump and loop filter and is input to the VCO, causing the output frequency to change. Eventually, the output signal will lock to the phase of the input reference signal. In this simple example, the output signal also will lock to the frequency of the input reference signal, but in most PLLs, counters on the input and output of the PLL are used to divide the input frequency, while a counter/divider in the feedback loop is used to multiply the input frequency. Thus the frequency of the output signal can be any rational multiple of the input frequency, but will be phase-locked to the input frequency.

However, the VCO typically has a substantial voltage gain, which can be correlated to the frequency range over which it is to operate. As a result, slight variations in the input and feedback signals, resulting from process, temperature and supply variations or other sources of noise, can be greatly magnified by the PLL, resulting in an output signal variation known as "jitter."

For example, for a PLL constructed using 90 nm integrated circuit technology, for which the minimum expected frequency is $f_{min}$=300 MHz, the maximum expected frequency is $f_{max}$=1000 MHz, the supply voltage is $V_{cc}$=1.2 V, and the device saturation voltage is $V_{DSsat}$=0.2 V, the VCO gain, $K_{VCO}$, can be estimated as $$K_{VCO} = (f_{max} - f_{min})/(V_{cc} - 2V_{DSsat})$$
$$= (1000 - 300)/(1.2 - 0.4)$$
$$= 875 \text{ MHz/V}.$$

Thus, even a 1 mV variation in the input signal can give rise to an output frequency variation of almost 1 MHz. Insofar as the voltages involved are almost always in generally the same range, the gain is effectively a function of the desired operating range, which is determined by the particular application.

The situation is similar for a DLL. A basic DLL includes a phase detector ("PD"), a charge pump, a loop filter and a voltage-controlled delay line ("VCDL"), connected in series. The input or reference signal is one input to the PD. An output of the VCDL is also fed back to another input of the PD. If the phase of the feedback signal is not locked to that of the input reference signal, then the PD output will be a signal (voltage) whose sign is indicative of whether the output leads or lags and whose magnitude is indicative of the amount of lead or lag. That signal is filtered by the charge pump and loop filter and is input to the VCDL, delaying the output and causing its phase to change. Eventually, the output signal will lock to the phase of the input reference signal. Unlike PLLs, DLLs do not affect the frequency of the signal; the output frequency will automatically match the input frequency.

However, like a VCO, a VCDL may have a substantial voltage gain. Thus, as with a PLL, slight variations in the input and feedback signals, resulting from process, temperature and supply variations or other sources of noise, can be greatly magnified by the DLL, resulting in output signal jitter.

It would be desirable to be able to reduce the jitter of a loop circuit without regard to its operating range. It would be particularly desirable to be able to control the jitter in a programmable way.

SUMMARY OF THE INVENTION

The present invention allows loop filter jitter to be reduced by providing in the loop filter a voltage-controlled compensation component—i.e., a voltage-controlled oscillator in a PLL OR a voltage-controlled delay line in a DLL—having a low-gain input and a high-gain input, and two separate feedback paths, one of which feeds the high-gain input and one of which feeds the low-gain input.

A high-gain coarse feedback path preferably includes in the PLL case a frequency detector ("FD") and in the DLL case a phase detector ("PD"), as well as a digital-to-analog converter ("DAC") to provide a voltage for input to the high-gain input of the compensation component. In the case of a PLL, the voltage is used to coarsely lock the VCO onto the correct frequency (without providing a phase lock, except possibly by chance). The degree of coarseness of the frequency lock preferably is programmably adjustable. In the case of a DLL, the voltage is used to coarsely lock the VCDL to the correct phase (frequency not being an issue in a DLL). Again, the degree of coarseness of the phase lock preferably is programmably adjustable.

Once coarse lock is achieved, the high-gain input preferably is fixed and a low-gain fine feedback path preferably is enabled. The low-gain fine feedback path preferably includes, in the PLL case a phase-frequency detector ("PFD"), and in the DLL case a second PD, as well as a charge pump and a loop filter as are commonly provided in loop circuits, to provide fine adjustment of the output frequency in the case of a PLL, as well as phase adjustment in either a PLL or a DLL. However, the compensation component input which the low-gain fine feedback path feeds preferably has a significantly lower gain than the input fed by the coarse feedback path. Therefore, for the same variation in the feedback signal (e.g., if there is a device-wide supply variation), the effect of the low-gain fine feedback path on the output phase (and frequency in the case of a PLL) is much less than the effect of the high-gain coarse feedback path on the output frequency in the case of a PLL or the output phase in the case of a DLL, and by the same token much less than the effect would be on the output phase (and frequency) in a conventional loop circuit. Moreover, the filtering characteristics of the charge pump and loop filter can be selected to better deal with the types of variations expected in the fine-feedback path. For example, the charge pump current can be made much smaller than the charge pump current in a conventional loop circuit.

The dual-gain VCO or VCDL can be constructed from a current-controlled oscillator ("CCO") or current-controlled delay line ("CCDL") with two different voltage-to-current converters ("V/Is"), with higher and lower gains, respectively, for the high-gain and low-gain signal paths. The gains of the two V/Is may be fixed, but preferably at least one is controllable or programmable as described in more detail below.

In accordance with this invention, there is provided a loop circuit having an input terminal for receiving a reference signal and an output terminal for outputting an output signal locked to the reference signal. The loop circuit includes a compensation component for producing said output signal. A high-gain coarse feedback path feeds the compensation component, accepting as inputs the reference signal and the output signal, and causing the compensation component to drive the output signal to within a predetermined variance from the reference signal. A low-gain fine feedback path also feeds the compensation component, accepting as inputs the reference signal and the output signal, and causing the compensation component to drive the output to a lock with the reference signal after the coarse feedback path has caused the compensation component to drive the output signal to within the predetermined variance from the reference signal.

The loop circuit may be a phase-locked loop, in which case the compensation component includes an oscillator for producing an output frequency, the reference signal is a reference frequency signal, and the output signal has the output frequency and an output phase. The high-gain coarse feedback path accepts as inputs the reference frequency and the output frequency, and causes the oscillator to drive the output frequency to within a predetermined variance from the reference frequency. The low-gain fine feedback path accepts as inputs the reference frequency and the output frequency, and causes the oscillator to drive the output to a phase-frequency lock with the reference frequency after the coarse feedback path has caused the oscillator to drive the output frequency to within the predetermined variance from the reference frequency.

The loop circuit also may be a delay-locked loop, in which case the compensation component includes controlled delay line for producing a phase-delayed output signal. The reference signal has an input phase and the output signal has an output phase. The high-gain coarse feedback path accepts as inputs the reference signal and the output signal, and causes the controlled delay line to drive the output phase to within the predetermined variance from the input phase. The low-gain fine feedback path accepts as inputs the reference frequency and the output frequency, and causes the controlled delay line to drive the output to a phase lock with the reference input signal after the coarse feedback path has caused the controlled delay line to drive the output phase to within the predetermined variance from the input phase.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 1 is a block diagram of a preferred embodiment of a phase-locked loop circuit according to the present invention;

FIG. 2 is a block diagram of a preferred embodiment of the dual-gain voltage controlled oscillator shown in FIG. 1;

DETAILED DESCRIPTION OF THE INVENTION

Figure 3:
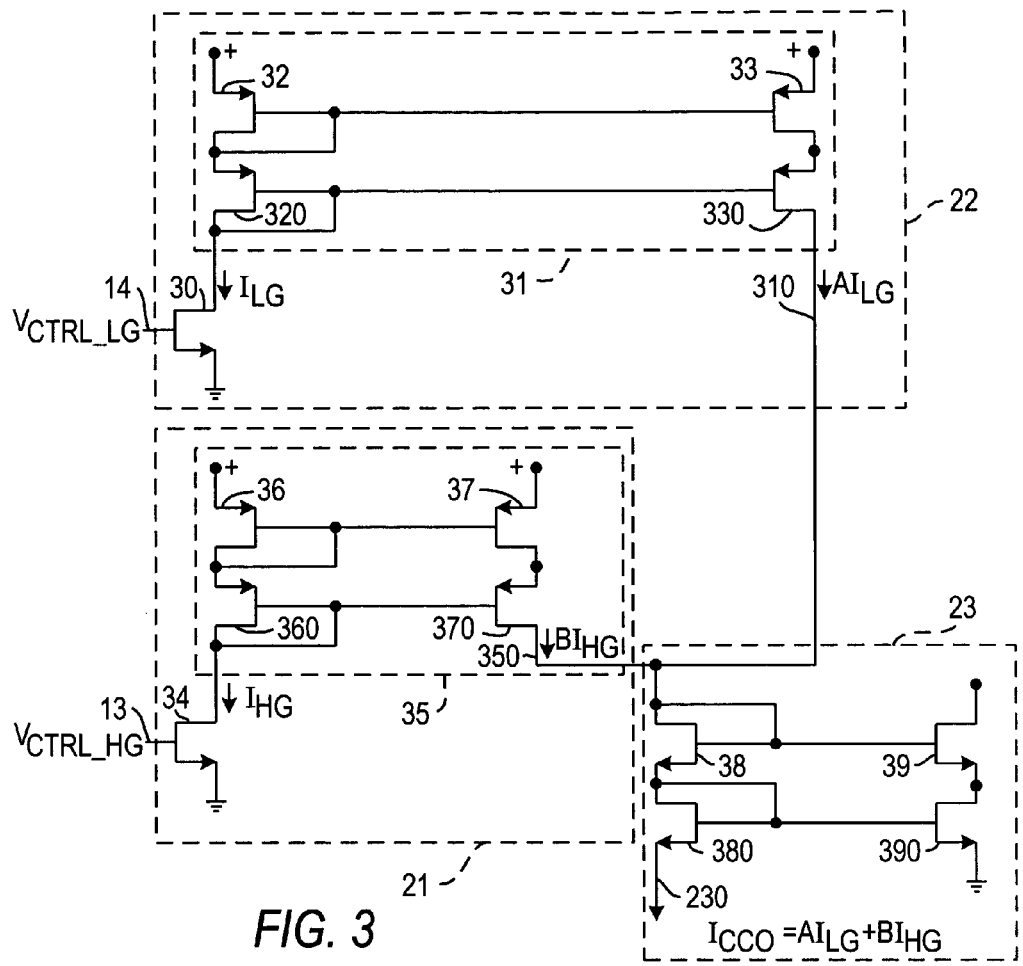
FIG. 3 is a schematic diagram of a preferred embodiment of a portion of the dual-gain voltage controlled oscillator shown in FIGS. 1 and 2.

As described above, the present invention reduces loop circuit jitter, without decreasing the allowable range of input voltages, by providing two separate feedback paths. A first feedback path provides coarse feedback to set the approximate output frequency of in the case of a PLL, or the approximate output phase in the case of a DLL. Although this path operates at a relatively high gain, its input voltage, and therefore its output frequency or phase component, is fixed once it brings the output frequency or phase within a desired range of the input frequency or phase. Thereafter, the contribution of the high-gain feedback path is constant, regardless of signal fluctuations in the feedback path. A second feedback path provides fine feedback to lock the precise output phase, as well as frequency in the case of a PLL. However, this path operates at a relatively low gain, so that signal noise (e.g., a power supply variation) will not cause a large phase or frequency variation in the loop circuit output. Despite the lower gain of this fine feedback path, the loop circuit of the invention, as a whole, retains a wide operating range as a result of the inclusion as well of the aforementioned coarse feedback path. As stated above, the component contributed by the coarse feedback path becomes fixed before the loop circuit is locked, so that notwithstanding the high gain of the coarse feedback path, voltage variations in the coarse feedback path are not multiplied by the high gain of that path to distort the loop circuit output.

The invention will now be described with reference to FIGS. 1–10.

FIG. 1 shows the basic layout of a preferred embodiment of a PLL 10 in accordance with the invention. In PLL 10, the standard voltage-controlled oscillator of known PLLs is replaced by a dual-gain VCO 11 which provides a basic output signal at node 12 as a function of both a control voltage 13 on a high-gain input 130 and a control voltage 14 on a low-gain input 140. The basic output signal at 12 is fed back on feedback path 15, which splits into a high-gain coarse feedback path 150 producing control voltage 13, and a low-gain fine feedback path 151 producing control voltage 14.

Coarse feedback path 150 preferably includes a frequency detector 152 (described in more detail below) in series with a digital-to-analog converter (which may be conventional). The feedback signal on path 150 preferably is compared to the input signal at node 16 by frequency detector 152, preferably in the manner described below, to provide a signal (preferably digital) representative of how much and in which direction the output frequency must change. That signal preferably is converted back to analog form by DAC 153 for provision as the high-gain control voltage $V_{CTRL\_HG}$ 13 to high-gain input 130 of dual-gain VCO 11.

Preferably, as explained in more detail below, as long as the frequency of the basic output signal at 12 varies by more than a predetermined variance from the desired frequency, control 17 holds low-gain control voltage $V_{CTRL\_LG}$ 14 constant and allows the output of frequency detector 152 to vary, driving the basic output signal frequency closer to the desired frequency. Once the basic output signal frequency approaches to within that predetermined variance from the desired frequency, control 17 preferably causes high-gain control voltage $V_{CTRL\_HG}$ 13 to be locked or fixed at its then-current value by stopping updating of the output of frequency detector 152 so that DAC 153 receives a constant input. Control 17 then turns on low-gain fine feedback path 151.

Fine feedback path 151 preferably is similar to a conventional PLL, having a phase-frequency detector 154, a charge pump 155 and a loop filter 156, providing low-gain control voltage $V_{CTRL\_LG}$ 14 as a function of the phase-frequency comparison of the feedback signal to the input signal at 16. Low-gain control voltage $V_{CTRL\_LG}$ 14 provides "fine-tuning" of the coarse frequency lock based on high-gain control voltage $V_{CTRL\_HG}$ 13, and also provides phase-lock, in the same manner as in a conventional PLL.

Up to now, the discussion has referred to the "basic output signal" at node 12 and the "input signal" at node 16, and has assumed that the feedback signal on path 15 is unchanged when it reaches frequency detector 152 or phase-frequency detector 154. Such a discussion could describe only a PLL that provides a phase-locked output signal with a frequency identical to its input signal. However, while such a PLL has its uses, a major advantage of PLLs is their ability to provide an output signal that is phase-locked to the input signal, but has a different frequency, and that is the reason that counters 180, 181 and 182 are provided.

Counters 180, 181 and 182 preferably serve as integer dividers of the frequencies of the respective signals passing through them. Thus, the frequency of "input signal" 16 is that of user input signal 160 divided by the value, N, stored in input scale counter 180. Similarly, the frequency of user output signal 120 is equal to that of basic output signal 12 divided by the value, K, stored in output scale counter 181. The effect of the value, M, stored in feedback scale counter 182 is to divide by M the frequency of the basic output signal 12 before it is compared to input signal 16 in either frequency detector 152 or phase-frequency detector 154, which has the effect of multiplying the output signal by M. The final result is that the frequency, $f_{out}$, of user output signal 120 bears the following relationship to the frequency $f_{in}$, of user input signal 160:

$$f_{out}=f_{in}\cdot M/(NK).$$

Because they derive from counters, the values of M, N and K normally are integers, and preferably are programmable by the user, so that the user can create an output frequency as any desired rational multiple of the input frequency (within the limits of the values of M, N and K that may be entered into the counters).

As explained above, VCO 11 is a dual-gain VCO, having a high-gain input 130 and a low-gain input 140. A preferred embodiment of VCO 11 is shown in FIG. 2, and includes a current-controlled oscillator 20, two voltage-to-current converters 21 and 22, and an adder 23 to add the two currents output by converters 21, 22. Converter 21 is designated the high-gain voltage-to-current converter $(V/I)_{HG}$, while converter 22 is designated the low-gain voltage-to-current converter $(V/I)_{LG}$. However, the "high" and "low" designations are relative, and are functions of the expected frequency range, as discussed above. For example, in the case discussed above where the expected frequency range is 300 MHZ to 1000 MHz, it may be that $(V/I)_{HG}=2$, while the range of fine tuning required in the low-gain feedback path is in the range of 100 MHz to 300 MHz, so that $(V/I)_{LG}=0.1$. In such an example, the sensitivity of PLL 10 to noise in the low-gain feedback path is 5% of the sensitivity in the high-gain feedback path, with the sensitivity in the high-gain feedback path being comparable to that of a conventional PLL.

One possible implementation of voltage-to-current converters 21, 22 and adder 23 is shown in FIG. 3. In this implementation, in voltage-to-current converter 22 low-gain control voltage 14 is applied to the gate of a NMOS transistor 30 whose source-drain path is connected between ground and a PMOS cascoded current mirror 31 formed by PMOS transistors 32, 33, 320, 330. The current $I_{LG}$ developed in transistor 30 may be given as follows:

$$I_{LG}=K_{30}(V_{CTRL\_LG}-V_{T30})^2,$$

where $V_{T30}$ is the threshold voltage of transistor 30 and $K_{30}$ is a constant for transistor 30 determined as follows:

$$K_{30}=(\mu_0 C_{ox}/2)(W/L),$$

where $\mu_0$ and $C_{ox}$ are process-determined constants for the semiconductor on which transistor 30 is formed, and W and L are dimensions of transistor 30.

The output current 310 of current mirror 31 has a magnitude $AI_{LG}$. The coefficient A may be considered the gain of voltage-to-current converter 22, and preferably is made relatively low as discussed above.

Similarly, in voltage-to-current converter 21 high-gain control voltage 13 is applied to the gate of a NMOS transistor 34 whose source-drain path is connected between ground and a PMOS cascoded current mirror 35 formed by PMOS transistors 36, 37, 360, 370. The current $I_{HG}$ developed in transistor 34 may be given as follows:

$$I_{HG}=K_{34}(V_{CTRL\_HG}-V_{T34})^2,$$

where $V_{T34}$ is the threshold voltage of transistor 34 and $K_{34}$ is a constant for transistor 34 determined in a manner similar to $K_{30}$ above.

The output current 350 of current mirror 35 has a magnitude $BI_{HG}$, where B is a coefficient determined by the relative sizes of transistors 36, 37, 360, 370. The coefficient B may be considered the gain of voltage-to-current converter 21, and is made relatively high as discussed above.

Finally, in the implementation of FIG. 3, adder 23 is simply an NMOS cascoded current mirror formed by NMOS transistors 38, 39, 380, 390, adding currents 310 and 350 to provide current 230 to CCO 20.

Figure 3A:
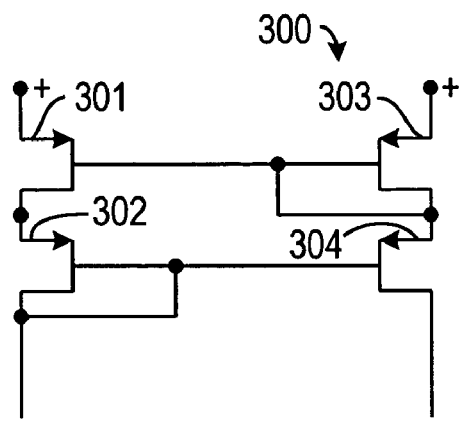

FIG. 3A shows an alternate embodiment of a current mirror circuit 300 that can be used in place of current mirrors 31 and 35 of FIG. 3. In circuit 300, PMOS transistors 301–304 are arranged as a modified Wilson mirror in which transistors 301, 302, 303, 304 take the places, respectively, of transistor 32 or 36, transistor 320 or 360, transistor 33 or 37, and transistor 330 or 370. Moreover, if NMOS transistors are substituted for PMOS transistors 301–304, the resulting NMOS modified Wilson mirror can be used in place of NMOS current mirror 23.

Figure 3B:
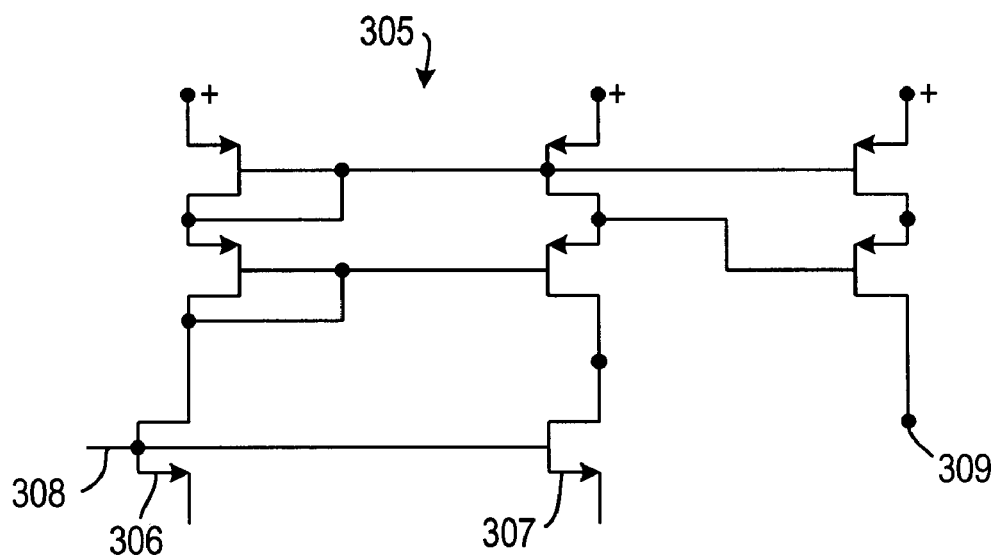

Another alternate embodiment of a current mirror circuit 305, which is particularly effective in cases of low voltage headroom, is shown in FIG. 3B. The PMOS variant shown in FIG. 3B can be substituted for current mirrors 31, 35, while the NMOS variant (not shown) can be substituted for current mirror 23. In this embodiment, the input voltage 308 is applied to both transistors 306 and 307, while the output is available at terminal 309.

Figure 4:
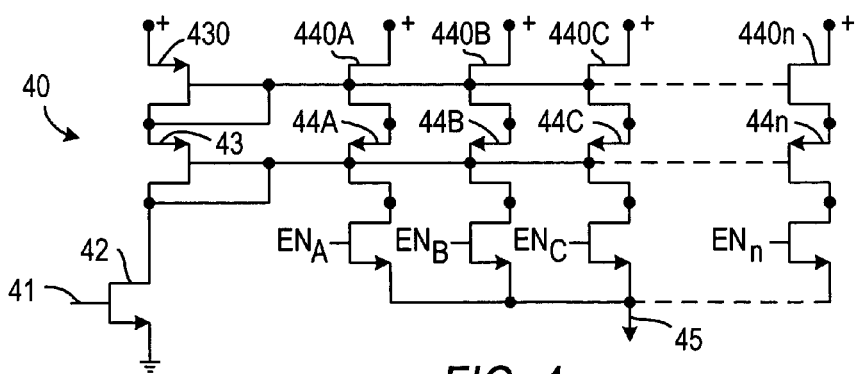
FIG. 4 is a schematic diagram of a portion of a preferred embodiment of a scalable version of a voltage-to-current converter of the type shown in FIG. 3.

While the coefficients A and B in FIG. 3 are controllable in the sense that the transistor dimensions that determine them can be selected during circuit design, FIG. 4 shows a circuit arrangement 40 that can be used in place of either converter 21 or 22 to provide user-controllable scaling of the output current(s). Although circuit arrangement 40 is based on the embodiment of FIG. 3, similar arrangements can be based on the embodiments of FIGS. 3A and 3B.

In circuit arrangement 40, input 41 is comparable to inputs 13, 14, transistor 42 is comparable to transistors 30, 34, and transistors 43, 430 are comparable to transistors 32, 320 or 36, 360. However, instead of a single output transistor pair 33/330 or 37/370, in arrangement 40 there are n output transistor pairs 44A/440A, 44B/440B, 44C/440C, . . . , 44n/440n arranged in parallel. Each of transistor pairs 44A/440A, 44B/440B, 44C/440C, . . . , 44n/440n can be turned on or off by respective enable signal $EN_A$, $EN_B$, $EN_C$, . . . , $EN_n$. In a programmable logic device, for example, each of these enable signals can be programmed by a respective configuration bit. The greater the number of transistor pairs 44A/440A, 44B/440B, 44C/440C, . . . , 44n/440n that are turned on, the higher the output current at 45 will be.

Figure 5:
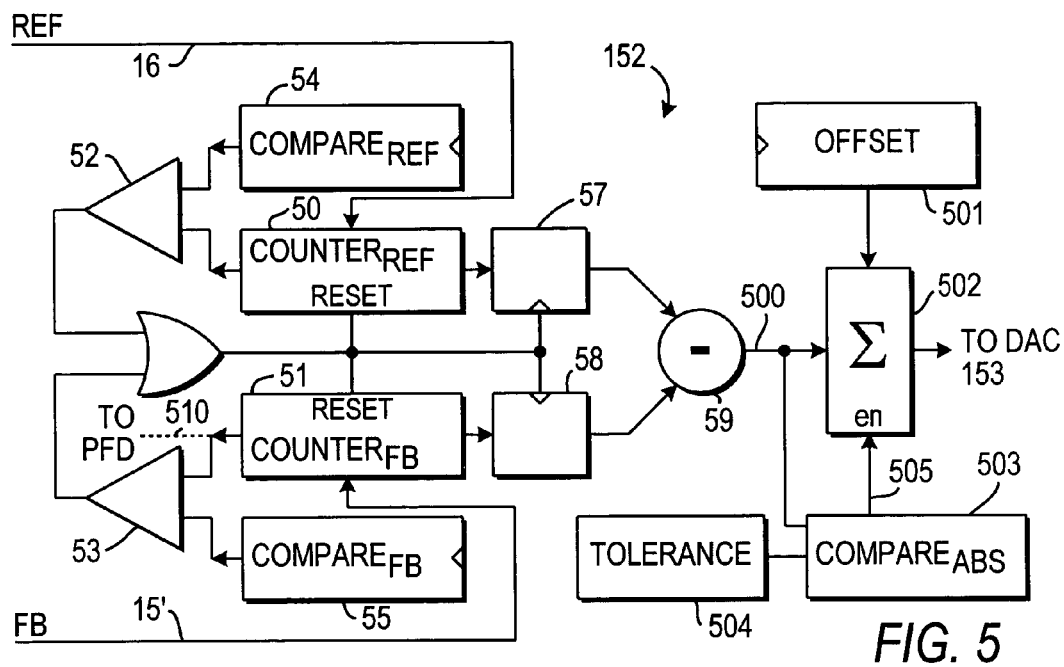
FIG. 5 is a block diagram of a preferred embodiment of the frequency detector of FIG. 1.

FIG. 5 shows a preferred embodiment of frequency detector 152 of FIG. 1. Reference input signal 16 is input to a reference counter 50, while feedback signal 15' (signal 15 after division by M) is input to a feedback counter 51. Comparators 52, 53 compare the values in counters 50, 51, respectively, to values stored in reference compare ($COMPARE_{REF}$) register 54 and feedback compare ($COMPARE_{FB}$) register 55. When the value in either reference counter 50 or feedback counter 51 exceeds the respective value in $COMPARE_{REF}$ register 54 or $COMPARE_{FB}$ register 55, as determined by comparator 52 or 53, OR gate 56 causes the respective values in counters 50, 51 to be registered in registers 57, 58, and then to be reset to zero. As counters 50, 51 begin counting again, the value in register 58 is subtracted from the value in register 57 by subtractor 59.

Normally, the values in $COMPARE_{REF}$ register 54 and $COMPARE_{FB}$ register 55 would be made equal. It can then be seen that if the value in register 57 exceeds the value in register 58, then reference counter 50 reached the reference comparison value first, meaning that the feedback frequency is too low. Therefore, the positive difference between the value in register 57 and the value in register 58 yields a positive control signal 500, signaling an increase in the output frequency. On the other hand, if the value in register 58 exceeds the value in register 59, then reference counter 51 reached the reference comparison value first, meaning that the feedback frequency is too high. Therefore, the negative difference between the value in register 57 and the value in register 58 yields a negative control signal 500, signaling a decrease in the output frequency.

An optional offset signal 501 may be added to signal 500 in accumulator 502. Signal 501 can be used to start VCO 11 at a frequency near the desired frequency, so that high-gain coarse frequency path 150 can achieve frequency lock faster.

The values in $COMPARE_{REF}$ register 54 and $COMPARE_{FB}$ register 55, as well as offset register 501, are selectable by the user according to the requirements of the user application. In the case where PLL 10 is being used in a programmable logic device, those registers preferably are among the programmable elements of the device.

As stated above, normally, the values in $COMPARE_{REF}$ register 54 and $COMPARE_{FB}$ register 55 will be the same. However, in certain applications, they may differ. For example, it may be possible to eliminate feedback scale counter 182 and achieve the same result by setting the value in $COMPARE_{FB}$ register 55 to M times the value in $COMPARE_{REF}$ register 54.

Figure 6:
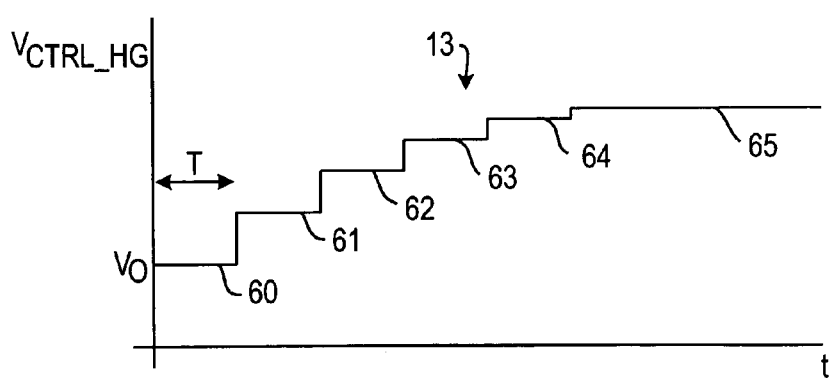
FIG. 6 is a plot showing an example of the variation of the voltage in the high-gain feedback path as a function of time.

FIG. 6 shows the high-gain control voltage 13 resulting from operation of frequency detector 152 as depicted in FIG. 5. The initial value $V_0$ is determined by the offset 501; otherwise the initial value would be the minimum output voltage that DAC 153 is capable of outputting. The voltage steps up in steps 60–65, each of duration T (this is just an example—in another case the voltage could step down instead of up, and/or the number of steps might be different). The value of T is a function of the values in $COMPARE_{REF}$ register 54 and $COMPARE_{FB}$ register 55. While those values may be the same or different, in either case they can be relatively large or relatively small. The larger the values, the longer the duration T of each of steps 60–65, representing a longer sampling period until the required number of clock cycles has been counted. The result would be a more accurate sampling, at the expense of taking longer to achieve a frequency lock.

Final "step" 65 represents a frequency lock condition. This condition may be indicated when the absolute value of the difference computed by subtractor 59 is smaller than a predetermined value. In a preferred embodiment, that predetermined value is 1—i.e., the difference computed by subtractor 59 is −1, 0 or +1.

When a frequency lock condition is thus indicated, the control signal 500, represented by the value in accumulator 502, may be locked by effectively turning off frequency detector 152 so that accumulator 502 is no longer updated. For example, in one embodiment frequency lock may be detected using absolute value comparator 503 to compare the absolute value of control signal 500, representing the difference, to a tolerance value stored at 504, which may be fixed or programmable. If the absolute value of the difference is less than the tolerance value, then signal 505 is set to disable accumulator 502 so that its accumulated value, which is output to DAC 153, no longer increases, but remains constant. Signal 505 (by connections not shown) also causes the other components of FD 152 to be turned off, except that in the aforementioned alternative embodiment in which feedback scale counter 182 is not used, feedback counter 51 may remain active to output feedback signal 15' to PFD 154 via optional connection 510.

Figure 7:
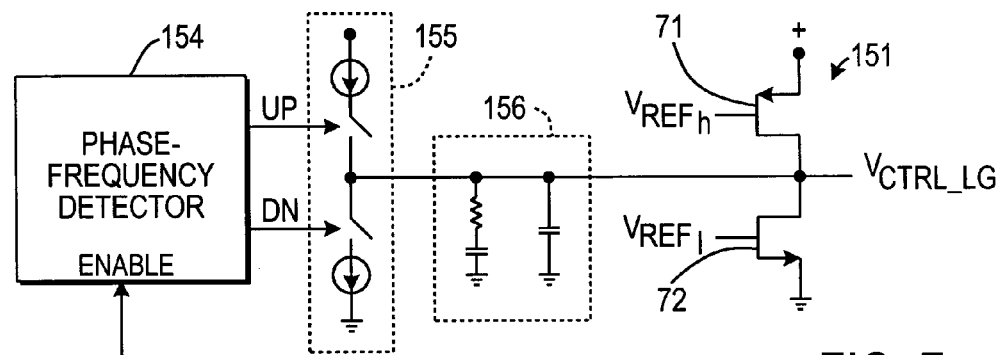
FIG. 7 is a schematic diagram showing a portion of a preferred embodiment of the control circuitry of the phase-locked loop circuit of FIG. 1.

The presence or absence of a frequency lock on high-gain coarse feedback path 150 also determines whether or not low-gain fine feedback path 151 is active. Details of a preferred embodiment of low-gain fine feedback path 151 are shown in FIG. 7. As long as there is no lock in high-gain coarse feedback path 150, low-gain fine feedback path 151 is kept inactive by applying a signal at 70 to disable phase-frequency detector 155, and applying suitable voltages to the gates of transistor 71 ($V_{REFh}$) and transistor 72 ($V_{REF1}$) to keep both of those transistors 71, 72 turned on, forcing low-gain control voltage $V_{CTRL\_LG}$ 14 to a constant value midway between $V_{CC}$ and ground (assuming identical values for both transistors 71, 72). In other embodiments, voltage 14 could be forced to another value, or a completely different way to deactivate low-gain fine feedback path 151 can be used.

When a frequency lock on high-gain coarse feedback path 150 is detected, low-gain fine feedback path 151 is activated by applying a signal at 70 to enable phase-frequency detector 155, and applying $V_{CC}$ to the gate of transistor 71 ($V_{REFh}$) and ground to the gate of transistor 72 ($V_{REF1}$), turning both of transistors 71, 72 off so that low-gain control voltage $V_{CTRL\_LG}$ 14 can assume any value required by phase-frequency detector 155. That voltage 14 will apply "fine-tuning" to the output 12 of VCO 11 generated by high-gain control voltage $V_{CTRL\_HG}$ 13 to drive the output 12 to a condition in which it is phase-and frequency-locked with input signal 16, as expected in a PLL.

PLL 10 thus gets most of the way to its locked condition based on a high-gain signal, but that signal is fixed after coarse frequency lock is achieved so that input noise does not cause variations in the output of that signal path. Although noise may occur in the signal on the fine control path, because that path has a smaller expected frequency range, it also magnifies the noise by a smaller amount, resulting in a more stable output.

If phase- and/or frequency-lock is lost during low-gain fine-feedback operation, PLL 10 preferably starts over, first seeking coarse frequency lock before again seeking fine phase-frequency lock. It may be on a loss only of phase that PLL 10 remains within the coarse frequency tolerance condition, in which case PLL 10 will revert to the low-gain fine-feedback mode after only one cycle in high-gain coarse feedback mode.

Figure 8:
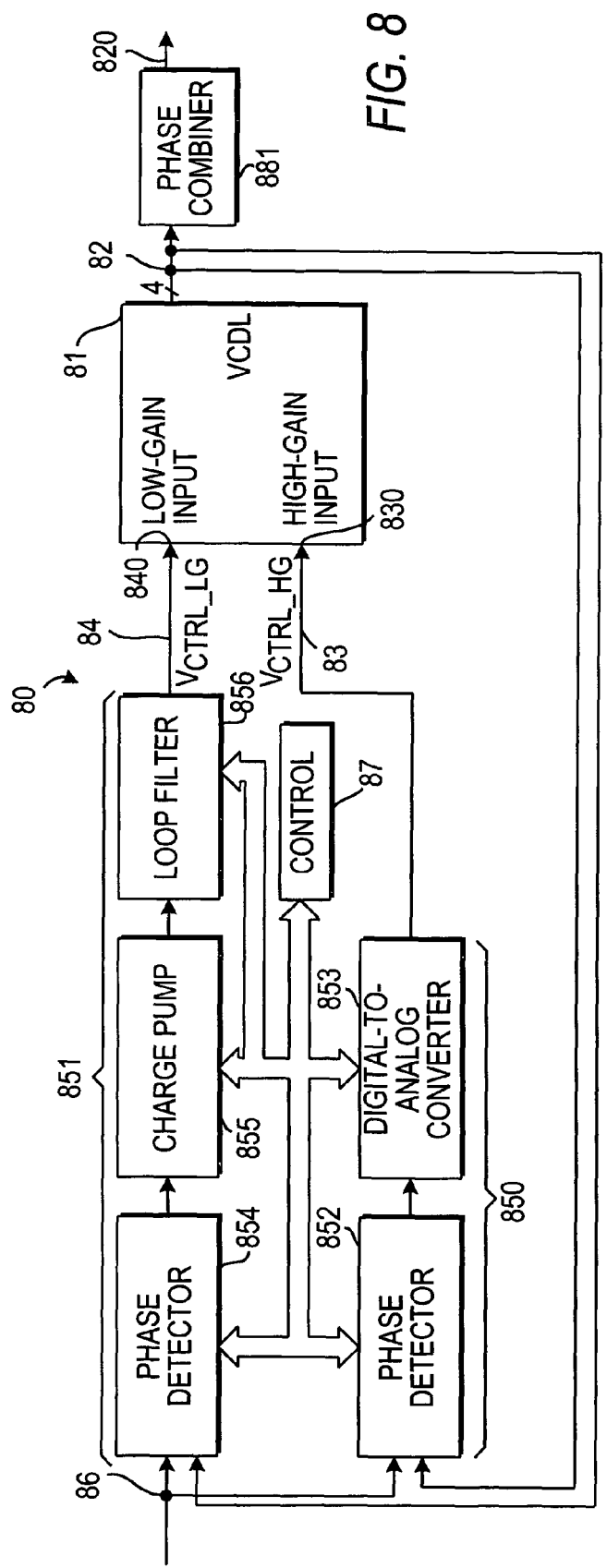
FIG. 8 is a block diagram of a preferred embodiment of a delay-locked loop circuit according to the present invention.

FIG. 8 shows the basic layout of a preferred embodiment of a DLL 80 in accordance with the invention. In DLL 80, the standard voltage-controlled delay line of known DLLs is replaced by a dual-gain VCDL 81. VCDL 81 preferably has a plurality of taps and therefore may provide a plurality of basic output signals at node 82 each having a different phase delay. For example, VCDL 81 may have four taps, each successive tap providing an output 90° from the preceding tap. The basic outputs are a function of both a control voltage 83 on a high-gain input 830 and a control voltage 84 on a low-gain input 840. The plurality of basic output signals may be combined by phase combiner 881 to provide a single output 820. Two of the output signals at 82 are fed back on a high-gain coarse feedback path 850 producing control voltage 83, and a low-gain fine feedback path 851 producing control voltage 84.

Coarse feedback path 850 preferably includes a phase detector 852 in series with a digital-to-analog converter 853 (which may be conventional). The feedback signal on path 850 preferably is compared to the input signal at node 86 by phase detector 852, preferably in the manner described below, to provide a signal (preferably digital) representative of how much and in which direction the output phase must change. That signal preferably is converted back to analog form by DAC 853 for provision as the high-gain control voltage $V_{CTRL\_HG}$ 83 to high-gain input 830 of dual-gain VCDL 81.

Preferably, as long as the frequency of the basic output signal on feedback path 850 varies by more than a predetermined variance from the desired phase, control 87 holds low-gain control voltage $V_{CTRL\_LG}$ 84 constant and allows the output of phase detector 852 to vary, driving the basic output signal phase closer to the desired phase. Once the basic output signal phase approaches to within that predetermined variance from the desired phase, control 87 preferably causes high-gain control voltage $V_{CTRL\_HG}$ 83 to be locked or fixed at its then-current value by stopping updating of the output of phase detector 852 SO that DAC 853 receives a constant input. Control 87 then turns on low-gain fine feedback path 851.

Fine feedback path 851 preferably is similar to a conventional DLL, having a phase detector 854, a charge pump 855 and a loop filter 856, providing low-gain control voltage $V_{CTRL\_LG}$ 84 as a function of the phase comparison of the feedback signal to the input signal at 86. Low-gain control voltage $V_{CTRL\_LG}$ 84 provides "fine-tuning" of the coarse phase lock based on high-gain control voltage $V_{CTRL\_HG}$ 83, in the same manner as in a conventional DLL.

Figure 9:
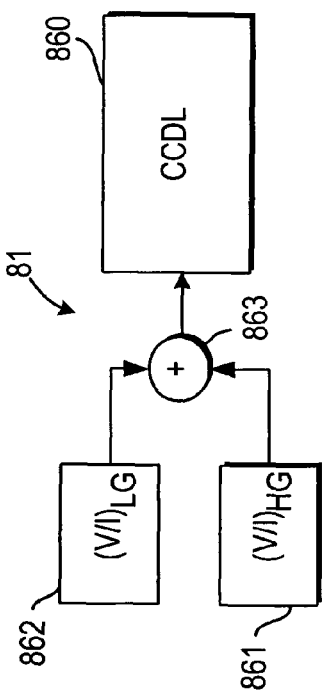
FIG. 9 is a block diagram of a preferred embodiment of the dual-gain voltage controlled delay line shown in FIG. 8.

As explained above, VCDL 81 is a dual-gain VCDL, having a high-gain input 830 and a low-gain input 840. A preferred embodiment of VCDL 81 is shown in FIG. 9, and includes a current-controlled delay line 860, two voltage-to-current converters 861 and 862, and an adder 863 to add the two currents output by converters 861, 862. Converter 861 is designated the high-gain voltage-to-current converter $(V/I)_{HG}$, while converter 862 is designated the low-gain voltage-to-current converter $(V/I)_{LG}$. However, the "high" and "low" designations are relative, and are functions of the expected phase range, as discussed above in connection with the PLL embodiment, as shown in FIGS. 1 and 2. The specifics of voltage-to-current converters 861, 862 may be similar to those of voltage-to-current converters 21, 22 as shown in FIGS. 3, 3A, 3B and 4.

Figure 10:
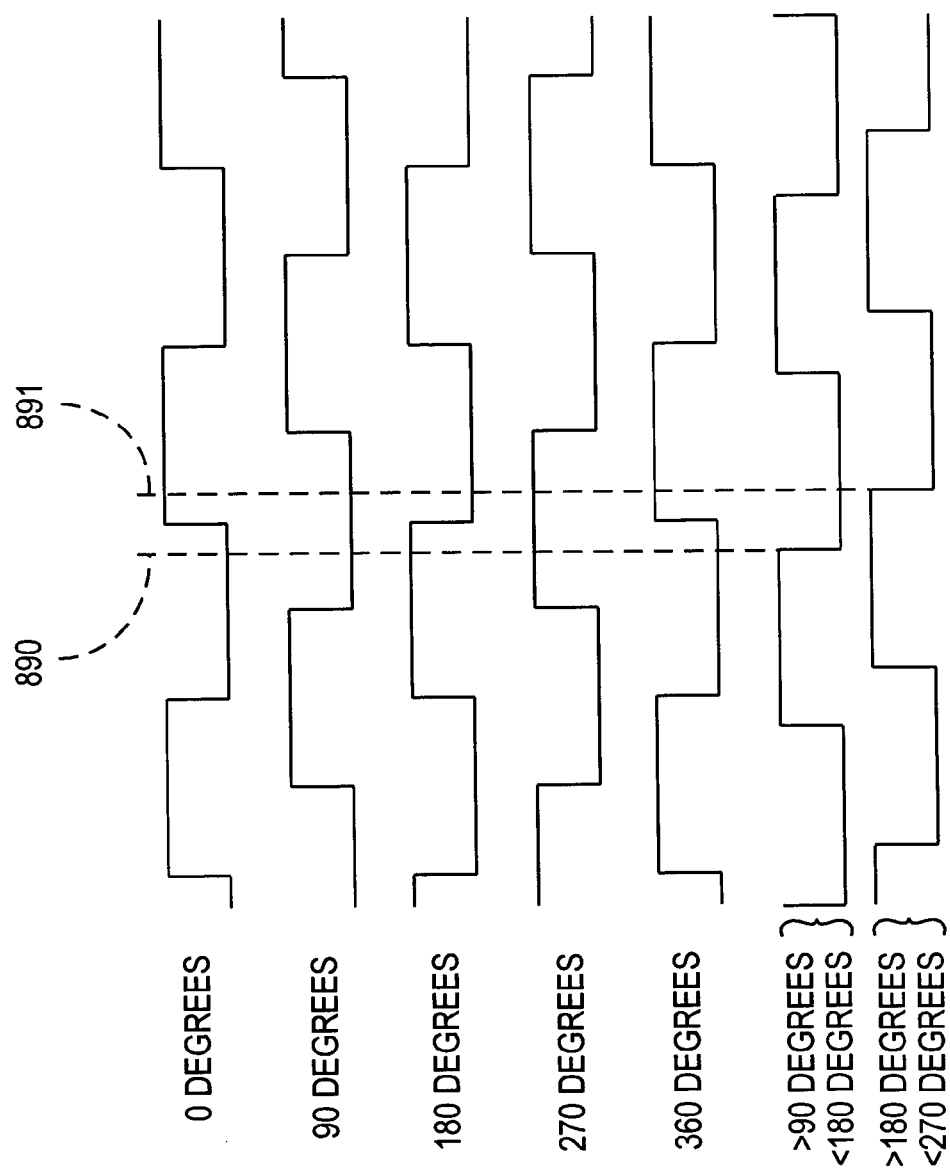
FIG. 10 is a plot showing a preferred embodiment of a determination of coarse phase lock according to the invention.

Similarly, the control circuit used to turn low-gain fine feedback path 851 on or off is similar to that shown in FIG. 7 for the PLL embodiment, and preferably turns path 851 on when it is determined that the phase on coarse feedback path 850 is sufficiently locked to that of input signal 86. One determination of sufficiency is shown in FIG. 10. A precise phase lock occurs when the falling edge on the 180° phase tap of VCDL 81 coincides with the rising edge of the input signal 86 (shown in FIG. 10 as the 0° phase delay). However, the control circuit may be designed to indicate coarse phase lock when the falling edge on the 180° tap is within the range indicated by dashed lines 890, 891 of the rising edge of input signal 86. As shown in FIG. 10, the range is substantially less than ±90°, but other ranges may be used.

Figure 11:
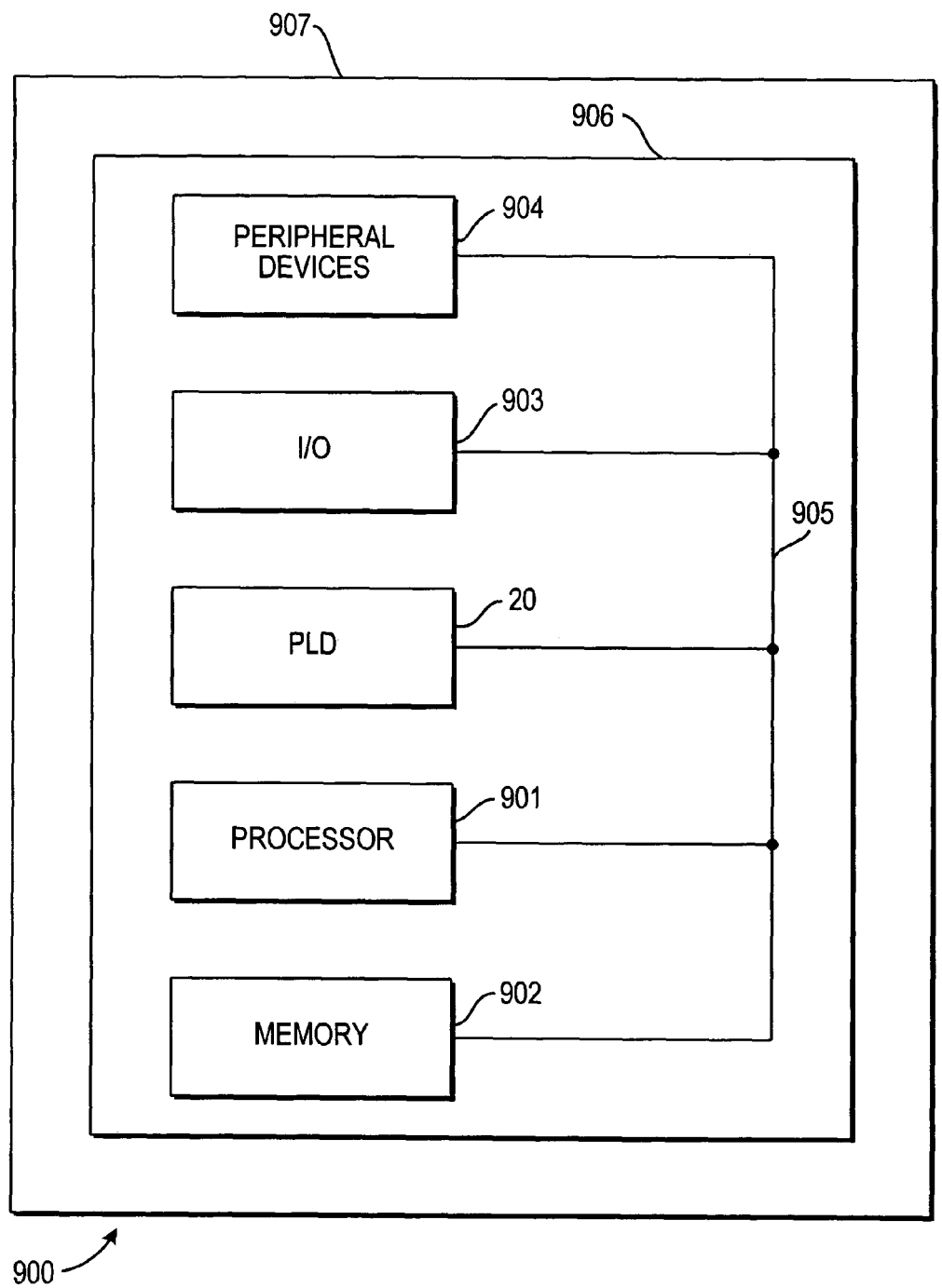
FIG. 11 is a simplified block diagram of an illustrative system employing a programmable logic device incorporating a phase-locked loop in accordance with the present invention.

A programmable logic device (PLD) 700 incorporating a PLL 10 according to the present invention may be used in many kinds of electronic devices. One possible use is in a data processing system 900 shown in FIG. 11. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 700 can be used to perform a variety of different logic functions. For example, PLD 700 can be configured as a processor or controller that works in cooperation with processor 901. PLD 700 may also be used as an arbiter for arbitrating access to a shared resources in system 900. In yet another example, PLD 700 can be configured as an interface between processor 901 and one of the other components in system 900. It should be noted that system 900 is only exemplary, and that the true scope and spirit of the invention should be indicated by the following claims.

Various technologies can be used to implement PLDs 700 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A phase-locked loop circuit having an input terminal for receiving a reference signal and an output terminal for outputting an output signal locked to said reference signal, and comprising:
   a compensation component comprising an oscillator for producing said output signal;
   a high-gain coarse feedback path feeding said compensation component, said high-gain coarse feedback path accepting as inputs a reference frequency of said reference signal and an output frequency of said output signal, and causing said compensation component to drive said output frequency to within a predetermined variance from said reference frequency, wherein said coarse feedback path comprises:
   a frequency detector having inputs connected to said input terminal and said output terminal, said frequency detector producing a coarse-adjust signal based on a difference between said output frequency and said reference frequency, and
   a high-gain signal modifier downstream of said frequency detector, said high-gain signal modifier having a first gain; and
   a low-gain fine feedback path feeding said compensation component, said low-gain fine feedback path accepting as inputs said reference frequency and said output frequency, and causing said compensation component to drive said output to a phase-frequency lock with said reference frequency after said coarse feedback path has caused said compensation component to drive said output frequency to within said predetermined variance from said reference frequency, wherein said fine feedback path comprises:
   a phase-frequency detector having inputs connected to said input terminal and said output terminal, said phase-frequency detector producing a fine-adjust signal based on said difference between said output frequency and said reference frequency, and
   a low-gain signal modifier downstream of said phase-frequency detector, said low-gain signal modifier having a second gain that is less than said first gain.

2. The loop circuit of claim 1 wherein:
   said oscillator is a current-controlled oscillator;
   said low-gain signal modifier is a voltage-to-current converter; and
   said high-gain signal modifier is a voltage-to-current converter.

3. The loop circuit of claim 2 wherein said first gain is twenty times said second gain.

4. The loop circuit of claim 1 wherein said first gain is ten times said second gain.

5. The loop circuit of claim 1 further comprising a control circuit adapted to disable said fine feedback path until said coarse feedback path is locked and to enable said fine feedback path after said coarse feedback path is locked.

6. The loop circuit of claim 1 wherein said frequency detector is programmable for user adjustment of said predetermined variance.

7. The loop circuit of claim 6 wherein said frequency detector comprises:
   a reference counter clocked by said reference frequency;
   a feedback counter clocked by said output frequency;
   at least one programmable register programmably storing a respective counter value;
   a reference comparator that compares said reference counter to said respective counter value;
   a feedback comparator that compares said feedback counter to said respective counter value; and
   combining circuitry that (a) when said reference counter reaches said respective counter value before said feedback counter, generates a control signal to increase said output frequency, and (b) when said feedback counter reaches said respective counter value before said reference counter, generates a control signal to decrease said output frequency.

8. The loop circuit of claim 7 wherein:
   said at least one programmable register consists of one programmable register; and
   said reference comparator and said feedback comparator respectively compare said reference counter and said feedback counter to a single counter value in said one programmable register.

9. The loop circuit of claim 7 wherein:
   said at least one programmable register comprises two programmable registers, a first one of which corresponds to said reference counter and a second one of which corresponds to said feedback counter; and
   said reference comparator and said feedback comparator respectively compare said reference counter and said feedback counter to respective counter values in said first and second programmable registers.

10. The loop circuit of claim 9 wherein said respective counter values in said first and second programmable registers are equal to one another.

11. The loop circuit of claim 9 wherein said respective counter values in said first and second programmable registers are different from one another.

12. The loop circuit of claim 7 wherein said combining circuitry comprises:
   a detector having as inputs outputs of said reference comparator and said feedback comparator, said detector producing a latch signal when either of (a) said reference comparator, and (b) said feedback comparator, produces an output indicative of one of said reference counter and said feedback counter reaching its respective counter value stored in said at least one register;
   a reference latch and a feedback latch that respectively latch values in said reference counter and said feedback counter when said detector produces said latch signal; and
   a subtractor that subtracts the value in said feedback latch from the value in said reference latch.

13. The loop circuit of claim 12 wherein said detector comprises an OR gate.

14. The loop circuit of claim 12 wherein said combining circuitry further comprises:
a programmable offset generator that generates an offset signal; and
an adder for combining said offset signal with said control signal.

15. The loop circuit of claim 1 wherein said coarse feedback path further comprises a digital-to-analog converter between said frequency detector and said high-gain signal modifier.

16. The loop circuit of claim 1 wherein said fine feedback path further comprises a charge pump and loop filter between said phase-frequency detector and said low-gain signal modifier.

17. The loop circuit of claim 1 further comprising an output scaling counter downstream of said output terminal.

18. The loop circuit of claim 1 further comprising an input scaling counter upstream of said input terminal.

19. The loop circuit of claim 1 further comprising a feedback scaling counter between said output terminal and each said feedback path.

20. The loop circuit of claim 1 wherein said predetermined variance is programmable.

21. An integrated circuit device comprising the loop circuit of claim 1.

22. A digital processing system comprising:
processing circuitry;
a memory coupled to said processing circuitry; and
an integrated circuit device as defined in claim 21 coupled to the processing circuitry and the memory.

23. A printed circuit board on which is mounted an integrated circuit device as defined in claim 21.

24. The printed circuit board defined in claim 23 further comprising:
memory circuitry mounted on the printed circuit board and coupled to the integrated circuit device.

25. The printed circuit board defined in claim 24 further comprising:
processing circuitry mounted on the printed circuit board and coupled to the memory circuitry.

26. A programmable logic device comprising the loop circuit of claim 1.

27. A digital processing system comprising:
processing circuitry;
a memory coupled to said processing circuitry; and
a programmable logic device as defined in claim 26 coupled to the processing circuitry and the memory.

28. A printed circuit board on which is mounted a programmable logic device as defined in claim 26.

29. The printed circuit board defined in claim 28 further comprising:
memory circuitry mounted on the printed circuit board and coupled to the programmable logic device.

30. The printed circuit board defined in claim 29 further comprising:
processing circuitry mounted on the printed circuit board and coupled to the memory circuitry.

31. A delay-locked loop circuit having an input terminal for receiving a reference signal and an output terminal for outputting an output signal locked to said reference signal, and comprising:
a compensation component comprising a controlled delay line for producing said output signal, wherein said output signal is phase-delayed;
a high-gain coarse feedback path feeding said compensation component, said high-gain coarse feedback path accepting as inputs said reference signal and said output signal, and causing said controlled delay line to drive an output phase of said output signal to within a predetermined variance from an input phase of said reference signal, wherein said coarse feedback path comprises:
a first phase detector having inputs connected to said input terminal and said output terminal, said first phase detector producing a coarse-adjust signal based on a difference between said output phase and said input phase, and
a high-gain signal modifier downstream of said phase detector, said high-gain signal modifier having a first gain; and
a low-gain fine feedback path feeding said compensation component, said low-gain fine feedback path accepting as inputs a reference frequency of said reference signal and an output frequency of said output signal, and causing said controlled delay line to drive said output signal to a phase lock with said reference input signal after said coarse feedback path has caused said controlled delay line to drive said output phase to within said predetermined variance from said input phase, wherein said fine feedback path comprises:
a second phase detector having inputs connected to said input terminal and said output terminal, said second phase detector producing a fine-adjust signal based on said difference between said output phase and said input phase, and
a low-gain signal modifier downstream of said second phase detector, said low-gain signal modifier having a second gain that is less than said first gain.

32. The loop circuit of claim 31 wherein said first gain is ten times said second.

33. The loop circuit of claim 31 further comprising a control circuit adapted to disable said fine feedback path until said coarse feedback path is locked and to enable said fine feedback path after said coarse feedback path is locked.

34. The loop circuit of claim 31 wherein said phase detector is programmable for user adjustment of said predetermined variance.

35. The loop circuit of claim 31 wherein said coarse feedback path further comprises a digital-to-analog converter between said phase detector and said high-gain signal modifier.

36. The loop circuit of claim 31 wherein said fine feedback path further comprises a charge pump and loop filter between said phase detector and said low-gain signal modifier.

37. The loop circuit of claim 31 wherein said predetermined variance is programmable.

38. A programm able logic device comprising the loop circuit of claim 31.

39. The loop circuit of claim 31 wherein:
said controlled delay line is a current-controlled delay line;
said low-gain signal modifier is a voltage-to-current converter; and
said high-gain signal modifier is a voltage-to-current converter.

40. The loop circuit of claim 39 wherein said first gain is twenty times said second gain.

* * * * *